United States Patent
Okahashi

(10) Patent No.: US 7,345,558 B2
(45) Date of Patent: Mar. 18, 2008

(54) CIRCUIT DEVICE

(75) Inventor: Tetsuhide Okahashi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 96 days.

(21) Appl. No.: 11/065,448

(22) Filed: Feb. 25, 2005

(65) Prior Publication Data

US 2005/0225409 A1  Oct. 13, 2005

(30) Foreign Application Priority Data

Feb. 25, 2004  (JP) ............... 2004-049802

(51) Int. Cl.
*H03H 7/00* (2006.01)
(52) U.S. Cl. .................... 333/175; 333/185
(58) Field of Classification Search ............. 333/175, 333/185
See application file for complete search history.

(56) References Cited

U.S. PATENT DOCUMENTS 5,036,302 A * 7/1991 Hales ..................... 333/202
5,351,023 A * 9/1994 Niiranen .................. 333/202
6,816,037 B2 * 11/2004 Hoffman ................. 333/202

FOREIGN PATENT DOCUMENTS

| JP | 9-247935 A | 9/1997 |
| JP | 2003-46357 A | 2/2003 |

* cited by examiner

*Primary Examiner*—Robert Pascal
*Assistant Examiner*—Kimberly E Glenn
(74) *Attorney, Agent, or Firm*—Birch, Stewart, Kolasch & Birch, LLP

(57) ABSTRACT

Coil(s) 11 and coil(s) 12 of LC resonant circuit(s) are oriented such that their centers are mutually perpendicular. For example, coil 11 might be mounted so as to stand upright on printed wiring board, and coil 12 might be mounted so as to lie flush against printed wiring board. Such configuration permitting lines of magnetic force from coil 11 and coil 12 to be oriented so as to be mutually perpendicular, lines of magnetic force from coil 11 and coil 12 do not merge, and coil 11 and coil 12 are not electromagnetically coupled. Accordingly, inductances of respective coils 11, 12 are unchanged; impedance frequency characteristics of respective LC resonant circuits are maintained at what they should be; and resonant impedance(s) is/are not lowered.

2 Claims, 4 Drawing Sheets

CIRCUIT DEVICE

BACKGROUND OF INVENTION

This application claims priority under 35 U.S.C. § 119(a) to Patent Application No. 2004-049802 filed in Japan on 25 Feb. 2004, the content of which is hereby incorporated herein by reference in its entirety.

1. Field of the Invention

The present invention relates to a circuit device comprising LC resonant circuit(s) that increase circuit impedance(s).

2. Description of the Related Art

Such circuit devices employ LC resonant circuit(s) so as to increase circuit impedance(s) as seen from the input side and/or the output side of the circuit.

For example, as shown in FIG. 6, LC resonant circuit 103, in which coil 101 and capacitor 102 are connected in parallel, might be inserted between input terminal 104 and low-impedance circuit 105, and the resonant frequency of LC resonant circuit 103 might be made to agree with the frequency of a pulsed signal which is input thereto from input terminal 104. Upon input of a pulsed signal from input terminal 104, LC resonant circuit 103 resonates, displaying high impedance and increasing impedance as seen from input terminal 104. This makes it possible to treat input terminal 104 as if it was separated from the circuit impedance of low-impedance circuit 105 and connected only to high-impedance circuit 106 (see Japanese Patent Application Publication Kokai No. 2003-46357).

However, while it may be sufficient to simply insert a single LC resonant circuit in front of or behind the circuit impedance when there is only a single circuit impedance, there will as shown in FIG. 7 be a plurality of LC resonant circuit coils 111, 112 mounted on printed wiring board 113 where it is necessary to increase multiple circuit impedances through employment of respective LC resonant circuits. And what is more, due to constraints on the size of printed wiring board 113 it may be necessary to arrange respective coils 111, 112 in close proximity. Where this is the case, lines of magnetic force S1, S2 from respective coils 111, 112 will mutually overlap, and respective coils 111, 112 will be mutually electromagnetically coupled. This being the case, the inductances of these coils 111, 112 will change, and the impedances of respective LC resonant circuits will change. This has led to lowering of impedance as seen from input terminal 104.

Furthermore, even where there is only a single LC resonant circuit, lines of magnetic force from the coil of the LC resonant circuit can be disturbed due to the influence of peripheral components; and where this is the case, the inductance of the coil will change, and the impedance of the LC resonant circuit will change.

Moreover, where the current drawn by the circuit device(s) is large (500 mA or greater), the current which flows through the LC resonant circuit(s) will also be large. Under such circumstances, it will be necessary to increase the size of the coil core(s) and/or to increase the diameter of the wire used in the coil(s), increasing the size and weight of the coil(s) itself or themselves. Such a coil of large size and weight has the disadvantage of being easily damaged, as it will be susceptible to damage upon impact when dropped or the like.

SUMMARY OF INVENTION

The present invention was conceived in light of such conventional problems, it being an object thereof to provide a circuit device preventing alteration in LC resonant circuit impedance(s) and/or permitting improved resistance to impact of LC resonant circuit coil(s).

In order to solve one or more of the foregoing and/or other problems, a circuit device in accordance with one or more embodiments of the present invention comprises a plurality of LC resonant circuits that increase a plurality of circuit impedances; wherein at least a portion of the LC resonant circuits are mutually adjacent; and coils of at least a portion of the mutually adjacent LC resonant circuits are oriented such that their centers are mutually perpendicular.

Such configuration permitting lines of magnetic force from mutually adjacent coils to be oriented so as to be mutually perpendicular, lines of magnetic force from respective coils do not merge, and respective coils are not electromagnetically coupled. Accordingly, inductances of respective coils are unchanged; impedance frequency characteristics of respective LC resonant circuits are maintained at what they should be; and resonant impedance(s) is/are not lowered.

Furthermore, a circuit device in accordance with one or more embodiments of the present invention may comprise a plurality of LC resonant circuits that increase a plurality of circuit impedances; the constitution being such that one or more coils of at least a portion of the LC resonant circuits are mounted at one or more printed wiring board front sides; one or more coils of at least a portion of the LC resonant circuits are mounted at one or more printed wiring board back sides; and the coils mounted at the printed wiring board front and back sides are disposed in mutually offset fashion such that the respective coils mounted at opposite sides of at least one of the printed wiring board or boards do not occupy directly opposing locations.

Because such constitution will permit sufficient separation between or among respective coils, lines of magnetic force from respective coils will not merge, respective coils will not be electromagnetically coupled, impedance frequency characteristics of respective LC resonant circuits will be maintained at what they should be, and resonant impedance(s) will not be lowered.

Moreover, a circuit device in accordance with one or more embodiments of the present invention comprises one or more LC resonant circuits mounted on one or more printed wiring boards and increasing one or more circuit impedances; wherein at least one coil of at least one of the LC resonant circuit or circuits is separated from at least one of the printed wiring board or boards so as to prevent change in at least one impedance of at least one of the LC resonant circuit or circuits.

Furthermore, in the context of a circuit device comprising one or more LC resonant circuits mounted on one or more printed wiring boards and increasing one or more circuit impedances, and one or more metal chassis for electromagnetically shielding at least a portion of the LC resonant circuit or circuits with respect to the exterior; wherein at least one coil of at least one of the LC resonant circuit or circuits is separated from at least one side wall of at least one of the metal chassis so as to prevent change in at least one impedance of at least one of the LC resonant circuit or circuits.

Such a constitution makes it possible for lines of magnetic force from coil(s) to be undisturbed by printed wiring board(s) and/or metal chassis side wall(s), inductance(s) of coil(s) to be unchanged, impedance frequency characteristics of LC resonant circuit(s) to be maintained at what they should be, and resonant impedance(s) to not be lowered.

Moreover, a circuit device in accordance with one or more embodiments of the present invention comprises one or more LC resonant circuits mounted on one or more printed wiring boards and increasing one or more circuit impedances; wherein one or more dielectric bodies having elasticity is captured between at least one coil of at least one of the LC resonant circuit or circuits and at least one of the printed wiring board or boards. It is preferred that least one of the dielectric body or bodies be foam resin and/or rubber or the like.

Because such constitution will permit dielectric body or bodies having elasticity to be captured between or among LC resonant circuit coil(s) and board(s), even where impact(s) is/are exerted on board(s), chassis, and/or the like, such impact(s) can be mitigated by dielectric body or bodies such that impact(s) is/are not directly propagated to coil(s). This permits improved resistance to impact of coil(s).

DETAILED DESCRIPTION OF THE INVENTION

Below, embodiments of the present invention are described in detail while referring to the attached drawings.

(1) First Embodiment

Figure 1:
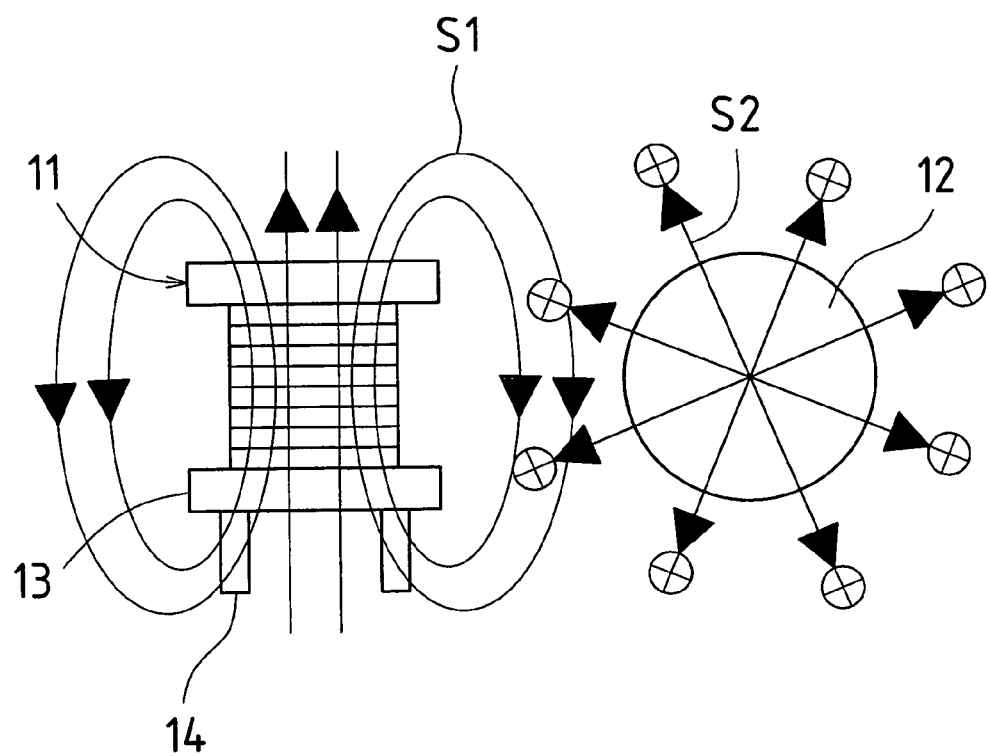
FIG. 1 is a drawing showing in conceptual fashion a first embodiment of a circuit device in accordance with the present invention.

FIG. 1 is a drawing showing in conceptual fashion a first embodiment of a circuit device in accordance with the present invention. The circuit device of the present embodiment employs first LC resonant circuit(s) and second LC resonant circuit(s) installed therein so as to increase two circuit impedances as seen from circuit input side(s) and/or output side(s).

This circuit device is equipped with first LC resonant circuit coil(s) 11 and second LC resonant circuit coil(s) 12. At coil 11, wire is wound around drum 13, this wire being connected to respective terminal pins 14 which protrude from the lower end of drum 13. Drum 13 may have either an air core or a magnetic core. The other coil 12 is constructed in similar fashion as coil 11.

Here, respective coils 11, 12 are oriented such that their centers are mutually perpendicular. For example, coil 11 might be mounted so as to stand upright on the printed wiring board, and coil 12 might be mounted so as to lie flush against the printed wiring board. Because such structure causes lines of magnetic force S1, S2 from respective coils 11, 12 to be mutually perpendicular, lines of magnetic force S1, S2 from respective coils 11, 12 do not merge. As a result, respective coils 11, 12 are not electromagnetically coupled; inductances of respective coils 11, 12 are unchanged; impedance frequency characteristics of respective LC resonant circuits are maintained at what they should be; and resonant impedance(s) is/are not lowered.

Note that where three coils are to be arranged therein, it is sufficient to arrange respective coils such that their centers are oriented in the directions of the x axis, y axis, and z axis. Furthermore, where three or more coils are to be arranged therein, it is sufficient to orient each coil such that its center is perpendicular to orientation(s) of other coil(s) which is/are adjacent thereto.

(2) Second Embodiment

Figure 2:
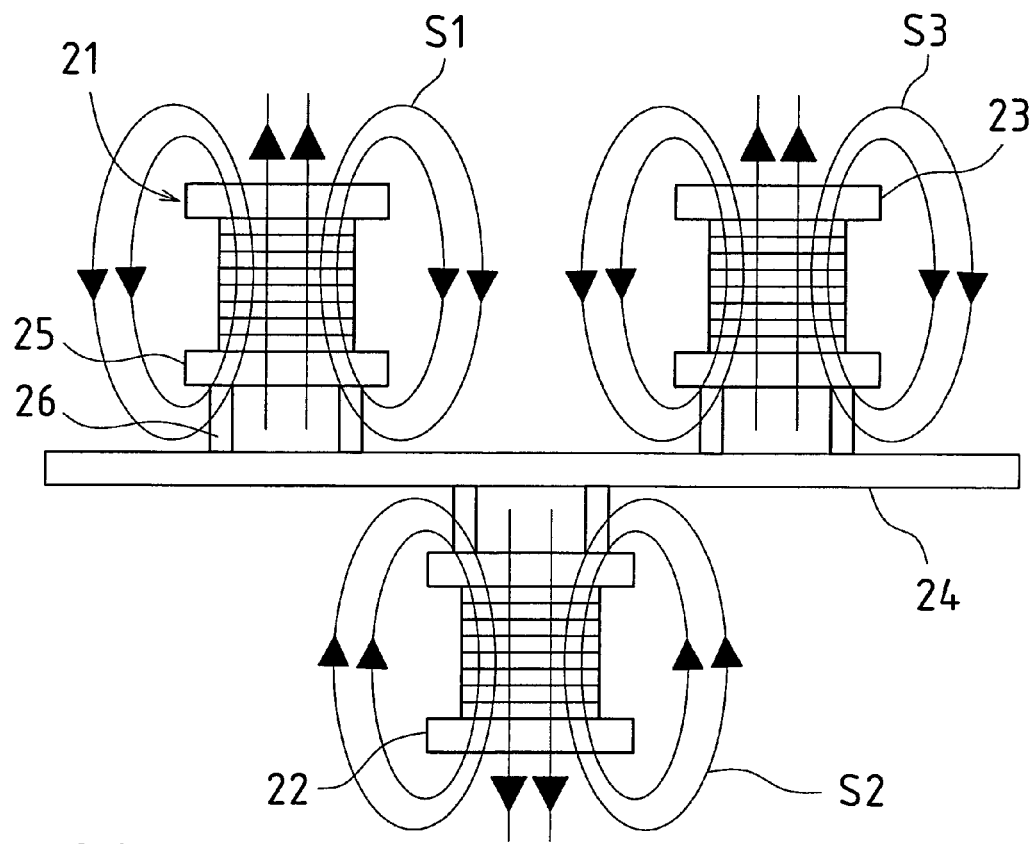
FIG. 2 is a side view showing a second embodiment of a circuit device in accordance with the present invention.

FIG. 2 is a side view showing a second embodiment of a circuit device in accordance with the present invention. The circuit device of the present embodiment employs first LC resonant circuit(s), second LC resonant circuit(s), and third LC resonant circuit(s) installed therein so as to increase three circuit impedances.

This circuit device is equipped with first LC resonant circuit coil(s) 21, second LC resonant circuit coil(s) 22, third LC resonant circuit coil(s) 23, and printed wiring board(s) 24 on which respective coils 21, 22, 23 are mounted. At coil 21, wire is wound around drum 25, this wire being connected to respective terminal pins 26 which protrude from the lower end of drum 25. Drum 25 may have either an air core or a magnetic core. The other respective coils 22, 23 are constructed in similar fashion as coil 21.

Here, respective coils 21, 22, 23 are respectively mounted at the front and back sides of printed wiring board 24, the respective coils 21, 22, 23 being disposed in offset fashion such that coils 21, 23 at the front side of printed wiring board 24 and coil 22 at the back side thereof do not occupy directly opposing locations. This being the case, there is sufficient separation between or among respective coils 21, 22, 23; lines of magnetic force S1, S2, S3 from respective coils 21, 22, 23 do not merge; respective coils 21, 22, 23 are not electromagnetically coupled; impedance frequency characteristics of respective LC resonant circuits are maintained at what they should be; and resonant impedances are not lowered.

Note that even where there are two coils or where there are four or more coils, similar effect may be obtained when respective coils are mounted such that one or more thereof is/are on the front side of printed wiring board 24 and one or more thereof is/are on the back side of printed wiring board 24 if coil(s) at the front side of printed wiring board 24 and coil(s) at the back side thereof are disposed in offset fashion.

(3) Third Embodiment

Figure 3:
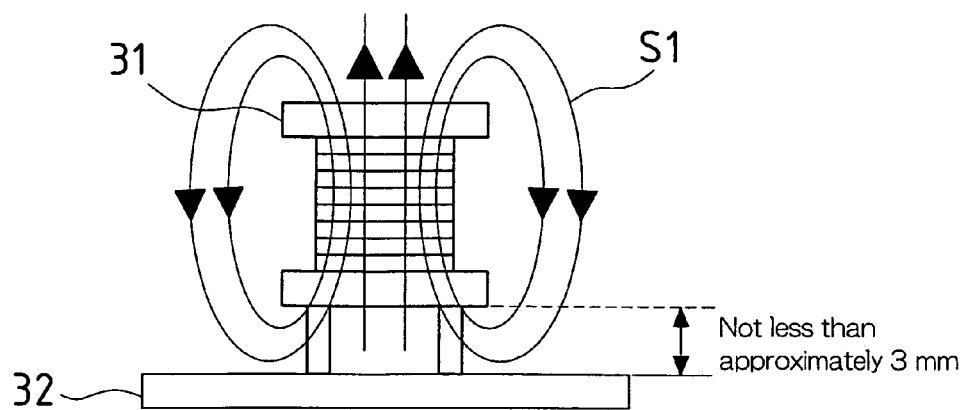
FIG. 3 is a side view showing a third embodiment of a circuit device in accordance with the present invention.

FIG. 3 is a side view showing a third embodiment of a circuit device in accordance with the present invention. As shown in FIG. 3, in the circuit device of the present embodiment, coil 31 of an LC resonant circuit installed therein so as to increase circuit impedance is separated from printed wiring board 32 by not less than 3 mm.

Because a variety of components are mounted on printed wiring board 32, it is possible that same will include magnetic material(s) thereamong. This being the case, if coil 31 were to be brought close to printed wiring board 32, lines of magnetic force S1 from coil 31 could be disturbed by magnetic material(s) at printed wiring board 32, changing the inductance of coil 31 and changing the impedance of the LC resonant circuit.

But where, as in the present embodiment, coil 31 is separated from printed wiring board 32 by not less than 3 mm, lines of magnetic force S1 from coil 31 will not be disturbed by magnetic material(s) at printed wiring board 32, the inductance of coil 31 will be unchanged, impedance frequency characteristics of the LC resonant circuit will be maintained at what they should be, and resonant impedance will not be lowered. Note that the distance of such separation may be determined based on the magnetic properties of printed wiring board 32, the relationship between same and the lines of magnetic force from coil 31, and so forth.

(4) Fourth Embodiment

Figure 4:
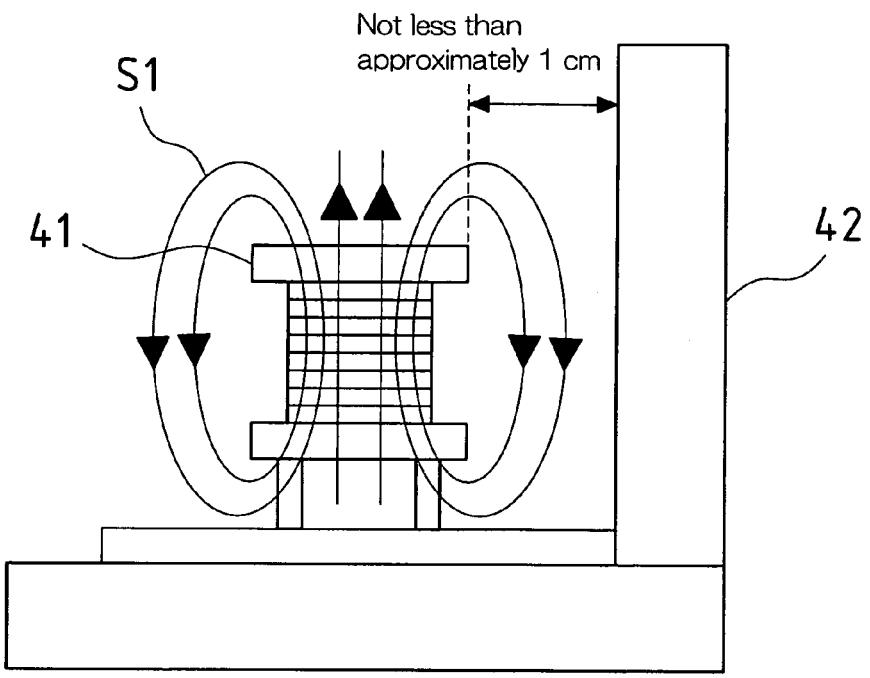
FIG. 4 is a side view showing a fourth embodiment of a circuit device in accordance with the present invention.

FIG. 4 is a side view showing a fourth embodiment of a circuit device in accordance with the present invention. In the circuit device of the present embodiment, coil 41 of an LC resonant circuit installed therein so as to increase circuit impedance is separated from a side wall of metal chassis 42 by not less than 1 cm.

Because chassis 42 serves as electrostatic shield and electromagnetic shield, magnetic body or bodies will often be employed for same. This being the case, if coil 41 were to be brought close to chassis 42, lines of magnetic force SI from coil 41 could be disturbed by chassis 42, changing the inductance of coil 41 and changing the impedance of the LC resonant circuit.

But where, as in the present embodiment, coil 41 is separated from the side wall of metal chassis 42 by not less than 1 cm, lines of magnetic force Si from coil 41 will not be disturbed by chassis 42, the inductance of coil 41 will be unchanged, impedance frequency characteristics of the LC resonant circuit will be maintained at what they should be, and resonant impedance will not be lowered.

(5) Fifth Embodiment

Figure 5:
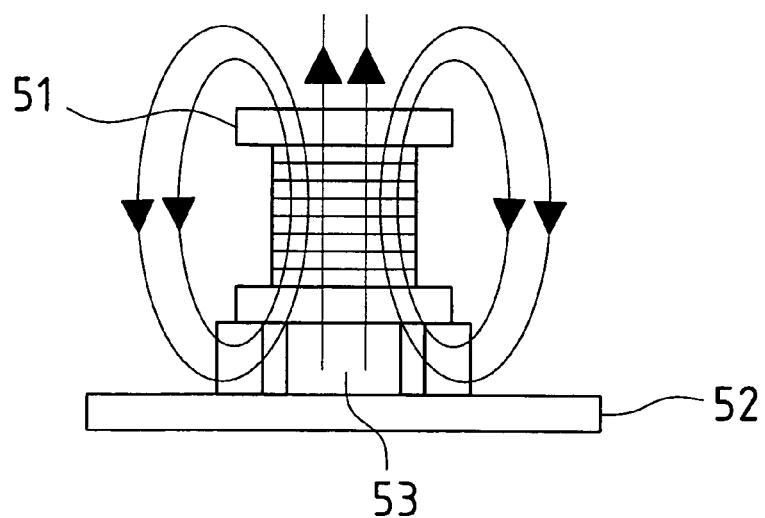
FIG. 5 is a side view showing a fifth embodiment of a circuit device in accordance with the present invention.
Figure 6:
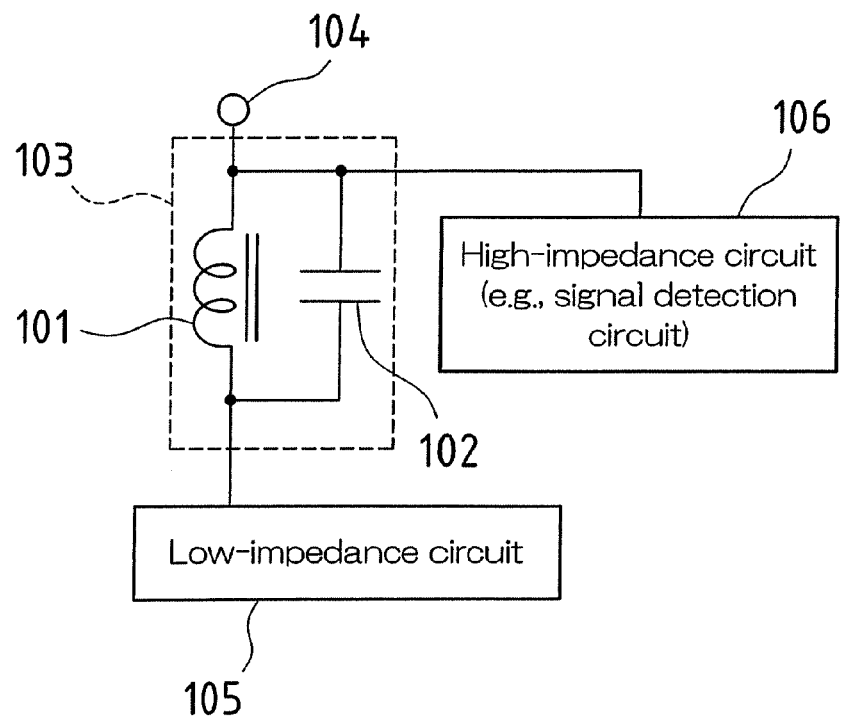
FIG. 6 is a circuit diagram indicating an example of an LC resonant circuit.
Figure 7:
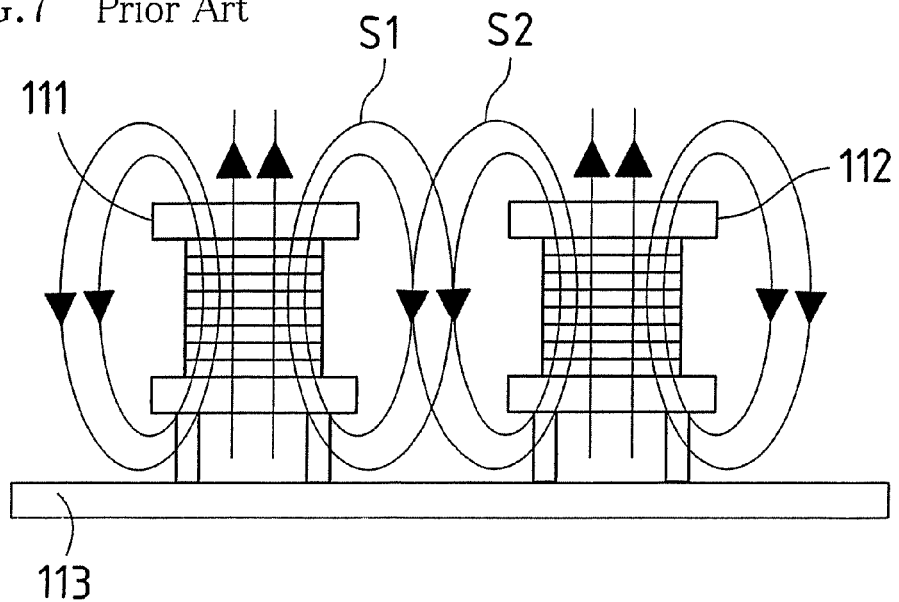
FIG. 7 is a side view showing how conventional LC resonant circuits might be arranged.

FIG. 5 is a side view showing a fifth embodiment of a circuit device in accordance with the present invention. In the circuit device of the present embodiment, foam resin dielectric body 53 is captured between printed wiring board 52 and coil 51 of an LC resonant circuit installed therein so as to increase circuit impedance.

Dielectric body 53 adheres to printed wiring board 52 by way of "double-sticky" tape (tape having adhesive on both sides thereof; not shown), coil 51 being mounted onto printed wiring board 52 thereover. Alternatively, double-sticky tape may also be present between coil 51 and dielectric body 53.

It is generally the case that where the current drawn by the circuit device is large (500 mA or greater), the current which flows through the LC resonant circuit will also be large, necessitating increase in the size of the core at coil 51 and/or increase in the diameter of the wire used in coil 51, increasing the size and weight of coil 51 itself and making coil 51 susceptible to damage upon impact.

But where, as in the present embodiment, foam resin dielectric body 53 is captured between coil 51 and printed wiring board 52, even where an impact is exerted on printed wiring board 52, the chassis, and/or the like, such impact can be mitigated by dielectric body 53, making it possible to avoid a situation in which the impact would propagate directly to coil 51. This permits improved resistance to impact of coil 51.

Note that rubber may be employed instead of foam resin for dielectric body 53.

Moreover, the present invention may be embodied in a wide variety of forms other than those presented herein without departing from the spirit or essential characteristics thereof. The foregoing embodiments, therefore, are in all respects merely illustrative and are not to be construed in limiting fashion. The scope of the present invention being as indicated by the claims, it is not to be constrained in any way whatsoever by the body of the specification. All modifications and changes within the range of equivalents of the claims are, moreover, within the scope of the present invention.

What is claimed is:

1. A circuit device, comprising:
   one or more LC resonant circuits, for providing one or more increased circuit impedance, mounted on one or more printed wiring boards; and
   one or more metal chassis for electromagnetically shielding at least a portion of the LC resonant circuit or circuits with respect to the exterior;
   wherein at least one coil of at least one of the LC resonant circuit or circuits is separated from at least one side wall of at least one of the metal chassis at least by such a distance that one or more magnetic forces from one or more coils of the one or more LC resonant circuits are not substantially disturbed by the one or more metal chassis so as to prevent change in at least one impedance of at least one of the LC resonant circuit or circuits.

2. A circuit device according to claim 1, wherein the at least one coil of at least one of the LC resonant circuit or circuits is separated from at least one side wall of at least one of the metal chassis by a distance not less than 1 cm.

* * * * *